United States Patent [19]

Lamont, Jr.

[11] 4,170,541

[45] Oct. 9, 1979

[54] ROTATING RESONATOR FOR LARGE SUBSTRATE TABLES IN SPUTTERING SYSTEMS

[75] Inventor: Lawrence T. Lamont, Jr., Palo Alto, Calif.

[73] Assignee: Varian Associates, Inc., Palo Alto, Calif.

[21] Appl. No.: 933,298

[22] Filed: Aug. 14, 1978

[51] Int. Cl.² ............................................. C23C 15/00
[52] U.S. Cl. .................................................. 204/298
[58] Field of Search ................ 204/192 R, 192 C, 298

[56] References Cited

U.S. PATENT DOCUMENTS

| | | | |
|---|---|---|---|
| 3,775,285 | 11/1973 | Lane | 204/298 |
| 4,021,277 | 5/1977 | Shirn et al. | 156/657 |
| 4,025,410 | 5/1977 | Stewart | 204/192 R |

OTHER PUBLICATIONS

W. Pennebaker, "Impedance Matching Circuit for RF Sputtering System", *IBM Tech. Disc. Bull.*, vol. 19, pp. 2809–2810, (1976).

R. P. Auyang et al., "Power Network for Substrate", *IBM Tech. Disc. Bull.*, vol. 14, p. 1032, (1971).

*Primary Examiner*—Aaron Weisstuch
*Attorney, Agent, or Firm*—Stanley Z. Cole; Edward H. Berkowitz

[57] ABSTRACT

An RF sputtering system having a rotating substrate table includes a resonant circuit adapted to rotate with the substrate table whereby reactive currents need not propagate across the rotating RF connector through which RF power is supplied to the rotating table.

5 Claims, 1 Drawing Figure

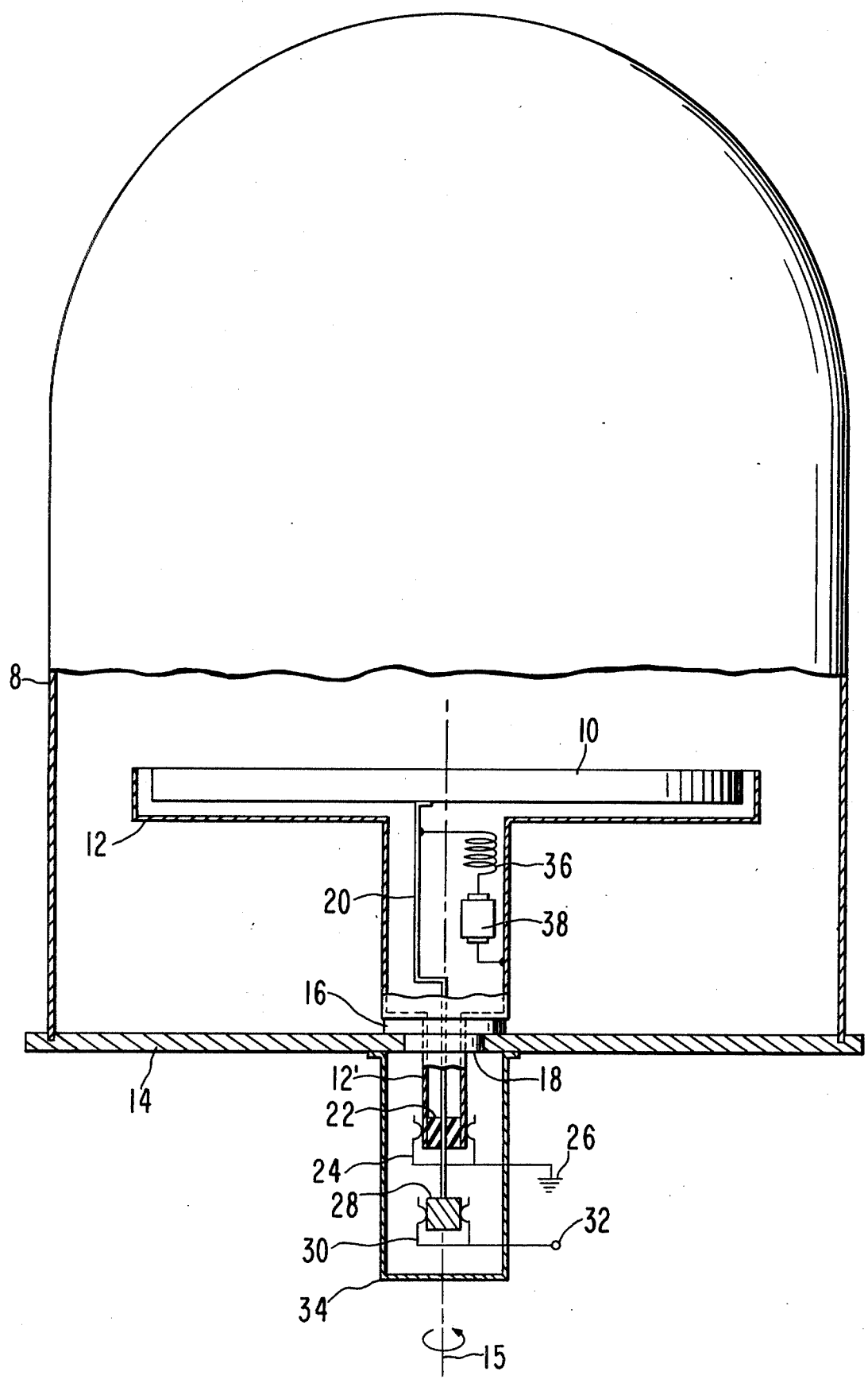

ROTATING RESONATOR FOR LARGE SUBSTRATE TABLES IN SPUTTERING SYSTEMS

FIELD OF THE INVENTION

This invention relates to apparatus for deposition of thin films and, in particular, to radio frequency sputtering apparatus.

Radio frequency sputtering is a well-known process by which a metal or an inorganic insulator may be deposited in vacuo as a thin film of controlled uniform thickness upon a substrate. Apparatus for coating articles by such processes utilize a target electrode (cathode) to supply the desired coating material and an anode for maintaining a plasma discharge with the cathode. The coating material is sputtered from the target upon impact by energetic positive ions created in the plasma discharge. Sputtered material deposits upon substrate surfaces, or articles to be coated, which are disposed in line-of-sight of the target.

Ordinarily, means must be provided for spatial manipulation of a number of articles or substrates and this is most commonly achieved by providing a rotating table having suitable electrical isolation to support radio frequency (RF) bias which can approach 10 KV peak-to-peak amplitude and which may be superimposed upon a DC bias of several kilovolts. Transmission of RF power through a rotating coupling necessarily entails practical complications which are exacerbated by a large capacitance (of order 1000 pf) to ground of the substrate table. Thus, large reactive currents must flow across the rotating coupling with the result that the rotating coupling suffers severe degradation; RF losses and undue RF interference result and eventually the coupling fails.

It is an object of the invention to produce a more power efficient RF coating apparatus and extend the useful life of rotating RF connectors.

In a feature of the invention, a resonant circuit is provided for rotation with said rotating table.

These and other goals are accomplished by placing resonant circuit in the rotating housing of the substrate table of the coating apparatus. By so doing, large magnitude RF reactive currents are localized to the rotating portion of the apparatus. Consequently, these large reactive currents need not flow across the sliding contacts of the rotating connector.

BRIEF DESCRIPTION OF THE DRAWING

The FIGURE is a partially schematic representation of the rotating resonator of the present invention.

DETAILED DESCRIPTION OF THE INVENTION

A representative apparatus of the present invention may be perceived from the Figure wherein a vacuum chamber 8 encloses the sputtering equipment including a substrate table 10 and ground shield 12. The ground shield includes a tubular projection 12' for communication through base plate 14. The substrate table 10 and ground shield are constrained to rotate together about axis 15. Mechanical bearing 16 and sliding seal 18 are provided to accommodate a rotational hermetic seal. RF buss 20 is provided to conduct RF power to substrate table 10. Insulator 22 maintains RF buss 20 electrically isolated from ground shield portion 12'. Grounding contact ring 24, which may be resilient metal finger stock, provides a sliding electrical contact of low resistance between ground shield portion 12' and electrical ground 26. RF buss 20 terminates in a cylindrical connector slug 28 which contacts RF power contact ring 30 which latter item may be structurally similar to grounding contact ring 28. RF power is directed to contact ring 30 through outer shield 34.

RF resonating means comprising inductor 36 and blocking capacitor 38 are provided, as for example, in series between RF buss 20 and ground shield 12, thereby providing a resonant load for the RF source not shown.

The RF resonating means efficiently couples RF power developed by an RF generator (not shown) to the RF discharge established at the target electrode. The RF energy is typically supplied at a frequency of 13.56 MHz. It will be appreciated by one skilled in the art that a typical commercially available RF source presents an impedance of the order of 50 ohms whereas the RF discharge is characterized by an impedance which is much larger in comparison therewith. An impedance matching network is commonly employed, thereby minimizing the RF reflection back to the source. Disposition of the resonant network on the stationary side of rotating contacts necessitates high RF current flow through the rotating coupler and the existence of these same RF currents over large surfaces from which RF power may be radiated.

It is apparent that many changes can be made in the above construction and many apparently widely differing embodiments of this invention could be made without departing from the scope thereof. Therefore, it is intended that all matter contained in the above description and shown in the accompanying drawing shall be interpreted as illustrative and not in a limiting sense.

What is claimed is:

1. A sputtering apparatus for connection to a radio frequency power generator for depositing material on articles, said apparatus comprising wall means defining a portion of a vacuum enclosure, rotating electrode means adapted to support radio frequency voltage, said rotating electrode further adapted to rotate with respect to said wall means, resonating circuit means disposed to rotate with said rotating electrode means, hermetic coupling means for coupling radio frequency energy to said rotating electrode through said wall means, said coupling means maintaining a substantially hermetic seal with said wall means.

2. The apparatus of claim 1 comprising a ground shield disposed between said wall means and said electrode means, said ground shield adapted to rotate with said electrode.

3. The apparatus of claim 1 wherein said rotating electrode is adapted to hold said articles.

4. The apparatus of claim 1 wherein said resonating circuit is resonant at the frequency of said radio frequency power generator.

5. The apparatus of claim 4 wherein said resonating circuit comprises an inductance and a capacitance.

* * * * *